(12) United States Patent
Sowards et al.

(10) Patent No.: US 6,950,336 B2
(45) Date of Patent: Sep. 27, 2005

(54) METHOD AND APPARATUS FOR EMULATING AN ELECTRICALLY ERASABLE PROGRAMMABLE READ ONLY MEMORY (EEPROM) USING NON-VOLATILE FLOATING GATE MEMORY CELLS

(75) Inventors: David Sowards, Fremont, CA (US); Trevor Blyth, Sandy, UT (US); Shane C. Hollmer, San Jose, CA (US)

(73) Assignee: Emosyn America, Inc., Sunnyvale, CA (US)

( * ) Notice: Subject to any disclaimer, the term of this patent is extended or adjusted under 35 U.S.C. 154(b) by 0 days.

(21) Appl. No.: 10/340,342

(22) Filed: Jan. 10, 2003

(65) Prior Publication Data

US 2003/0189858 A1 Oct. 9, 2003

Related U.S. Application Data

(63) Continuation-in-part of application No. 10/022,314, filed on Dec. 18, 2001, now Pat. No. 6,510,081, which is a continuation of application No. 09/564,324, filed on May 3, 2000, now Pat. No. 6,400,603.

(51) Int. Cl.$^7$ .............................................. G11C 16/04
(52) U.S. Cl. ........................... 365/185.12; 365/185.18; 365/185.02
(58) Field of Search ...................... 365/185.12, 185.18, 365/185.02, 185.13

(56) References Cited

U.S. PATENT DOCUMENTS

| | | | |
|---|---|---|---|
| 5,103,425 A | * 4/1992 | Kuo et al. | ............. 365/185.12 |
| 5,191,556 A | * 3/1993 | Radjy | ................... 365/185.12 |
| 5,339,279 A | 8/1994 | Toms et al. | |
| 5,365,484 A | 11/1994 | Cleveland et al. | |
| 5,646,890 A | 7/1997 | Lee et al. | |
| 5,682,350 A | 10/1997 | Lee et al. | |
| 5,687,121 A | 11/1997 | Lee et al. | |
| 5,765,185 A | 6/1998 | Lambrache et al. | |
| 5,852,577 A | 12/1998 | Kianian et al. | |
| 5,890,192 A | 3/1999 | Lee et al. | |
| 5,943,266 A | 8/1999 | Ogura et al. | |
| 6,181,599 B1 | 1/2001 | Gongwer | |
| 6,400,603 B1 | 6/2002 | Blyth et al. | |
| 6,473,341 B1 | * 10/2002 | Gomiero et al. | ....... 365/185.18 |
| 2003/0145154 A1 | * 7/2003 | Barnett et al. | .............. 711/103 |

OTHER PUBLICATIONS

PCT International Search Report mailed on Jan. 27, 2005 corresponding to PCT/US03/41581.

* cited by examiner

*Primary Examiner*—Huan Hoang
(74) *Attorney, Agent, or Firm*—Ryan, Mason & Lewis, LLP; Emosyn America, Inc.

(57) ABSTRACT

An emulated EEPROM memory array is disclosed based on non-volatile floating gate memory cells, such as Flash cells, where a small group of bits share a common source line and common row lines, so that the small group of bits may be treated as a group during program and erase modes to control the issues of program disturb and effective endurance. The bits common to the shared source line make up the emulated EEPROM page which is the smallest unit that can be erased and reprogrammed, without disturbing other bits. The memory array is physically divided up into groups of columns. One embodiment employs four memory arrays, each consisting of 32 columns and 512 page rows (all four arrays providing a total of 1024 pages with each page having 8 bytes or 64 bits). A global row decoder decodes the major rows and a page row driver and a page source driver enable the individual rows and sources that make up a given array. The page row drivers and page source drivers are decoded by a page row/source supply decoder, based on the addresses to be accessed and the access mode (erase, program or read).

17 Claims, 8 Drawing Sheets

METHOD AND APPARATUS FOR EMULATING AN ELECTRICALLY ERASABLE PROGRAMMABLE READ ONLY MEMORY (EEPROM) USING NON-VOLATILE FLOATING GATE MEMORY CELLS

CROSS-REFERENCE TO RELATED APPLICATIONS

This application is a continuation-in-part of U.S. patent application Ser. No. 10/022,314, entitled "Electronically-Erasable Programmable Read-Only Memory Having Reduced-Page-Size Program and Erase," filed Dec. 18, 2001, now U.S. Pat. No. 6,510,081 which is a continuation of U.S. patent application Ser. No. 09/564,324, entitled "Electronically-Erasable Programmable Read-Only Memory Having Reduced-Page-Size Program and Erase," filed May 3, 2000, now U.S. Pat. No. 6,400,603, each assigned to the assignee of the present invention and incorporated by reference herein.

FIELD OF THE INVENTION

The present invention relates generally to a method and apparatus for storing program code and/or data in a semiconductor circuit, such as a secure integrated circuit or a smart card, and more particularly, to a method and apparatus for emulating an electrically erasable programmable ROM (EEPROM) storage device using Flash cells.

BACKGROUND OF THE INVENTION

Semiconductor circuits generally include different memory technologies for storing program code and data. Typically, read only memory (ROM) storage technologies have been employed to store program code and electrically erasable programmable ROM (EEPROM) storage technologies have been employed to store data. In order to reduce the required surface area and the overall complexity of semiconductor circuits, however, it is desirable to replace the ROM and EEPROM storage technologies with a single storage technology that is suitable for storing both program code and data.

Over time, the meaning of the term "EEPROM" has changed from the general meaning—electrically erasable programmable ROM—to a meaning that refers to a specific type of non-volatile memory. The specific type of memory is addressable in small, often byte-sized, segments and consists of cells that generally contain two transistors. One transistor has a floating gate to store data; the second transistor is for selection purposes and isolates the floating gate transistor from the rest of the memory and therefore isolates unrelated electrical stimuli that can alter or "disturb" the data contents on the floating gate. The term "Flash" memory refers to memory architectures in which large numbers of memory cells are simultaneously written to the same data state—in a "flash." Strictly speaking, Flash memories may consist of cells that contain any number of transistors, but the more recent, popular meaning refers to cells that contain a single transistor. In the following description, "EEPROM" refers to byte-addressable memories consisting of two-transistor memory cells and "Flash" refers to memories consisting of single transistors, large numbers of which can be erased simultaneously.

Non-volatile floating gate memory cells, such as the split gate Flash cell from Silicon Storage Technology, Inc. (SSTI) of Sunnyvale, Calif., are attractive candidates for replacing both ROM and EEPROM, due to their small cell size, high reliability, low power requirements, fast erase, and built-in select transistor. While EEPROM storage technologies require two transistors for each memory cell, Flash storage technologies only require one transistor for each memory cell. Flash storage technologies can emulate ROM storage technologies quite easily. Emulating the ability of EEPROM storage technologies to rewrite small portions of the memory array, however, proves quite difficult, mainly due to disturb conditions and reduced endurance.

FIG. 1 illustrates a conventional array 100 of split gate Flash transistors, such as the transistor MN0. Each split gate transistor is in a programmed or charged to a high threshold state when electrons are trapped on the floating gate. The programmed state is reached by applying a high voltage, on the order of 10 volts, to the source line (SOURCE) of the transistor MN0, a select voltage, on the order of 1.5 volts, to the control gate (GATE) of the transistor MN0, and a constant current, on the order of 2 $\mu$A, to the drain line (often referred to as the bit line) (DRAIN) of the transistor MN0. Under the conditions of the programmed state, hot electrons are generated under the split gate region and swept onto the floating gate by the high field that has been coupled onto the floating gate. This programming condition is often referred to as "source side channel hot electron programming."

The selected transistor in an array 100 of transistors is the transistor where the selected column intersects with the selected row line. As shown in FIG. 1, there are several unselected transistors that are subjected to one or more of the programming conditions but are not the target (selected) cell. These cells are subject to program disturb, in which the electrical stimuli that are applied to the selected transistor are also partly, and undesirably, applied to the unselected cells. If transistor MN0 is the target cell, transistor MN1 is subjected to program conditions on the source and drain but has an unselected row or gate. Transistor MN3 sees the program conditions on the row and source lines but has an unselected drain line. The unselected condition on any one of the three transistor nodes is enough to inhibit significant programming during a single cycle but some incremental amount of disturb is incurred during each programming cycle. A large number of program cycles and therefore a large number of disturb events may eventually lead to a memory failure.

The erased (low threshold) state of a split gate Flash transistor, such as the transistor MN0, is achieved by discharging the floating gate via tunneling. This is achieved by applying a high voltage to the row of the target cell, while the source and drain are grounded. Strong capacitive coupling between the floating gate and the source node maintains a low voltage on the floating gate. This produces a large electric field between the control gate and the floating gate and subsequently electron tunneling, from floating gate to control gate, can take place. If transistor MN0 is the target cell, transistor MN3 will also be erased, since it shares a common row and source.

The architecture shown in FIG. 1 has a single source line connecting multiple pairs of rows. Alternatively, other prior art architectures have a single source line connecting a single pair of rows. In this case, similar program disturb conditions exist to those described above, but the number of disturb events on any row can be reduced. The cells on one pair of rows are not exposed to a disturb voltage on the source line during the time that a different pair of rows is being programmed. Further improvements to disturb characteristics are obtained by performing an erase and programming all cells in the pair of rows, as described, for example, in U.S. Pat. No. 5,289,411). Nevertheless, a large number of cells (i.e., much greater than a single byte) share a source line and a significant number of disturb events can occur.

In addition to program disturb, prior art memory arrays utilizing Flash memory cells may have reduced effective endurance. In many applications, including smart cards, the number of bytes of new data to be written at any one time is small. Since the erase block in a Flash array is relatively large, many bytes in the same block do not need to change data but are nevertheless erased because all bytes contained in the same erase block must be erased simultaneously. Such bytes are first read then erased and re-written with the same data that was held previously. Thus, many bytes experience unnecessary erase and programming cycles that would not otherwise be required, if the erase block was small. The number of times that a single bit can be erased and programmed and still maintain its ability to store new data without errors is finite and is referred to as endurance. While the intrinsic endurance is a function of cell characteristics and is not appreciably affected by architecture, the unnecessary erase program cycles subtract from the total number of cycles available for useful data changes.

Furthermore, the relatively large size of the erase block increases the amount of time required to program new data, if the number of bytes that are actually changing is small. Since all bytes contained in the same erase block must be erased simultaneously, there may be bytes that do not change but need to be re-written. Unlike the erase operation, the number of bytes that can be programmed simultaneously is limited by the capability of circuits peripheral to the memory array. Since the number of bytes that are programmed simultaneously is limited, the large erase block increases the required time to program small amounts of data.

Many semiconductor circuits require the switching of high voltages. For example, non-volatile memory devices on such semiconductor circuits require voltages to erase and program the memory device that are significantly higher than the voltages needed for other device functions. For example, in one exemplary technology, voltages of 15 volts on the gate and 10 volts on the source are required for the erase and program modes, respectively. Gated diode breakdown is a well-known condition that can occur in a metal oxide semiconductor (MOS) transistor under certain conditions. The drain/source breakdown voltage (BVDSS) is the drain/source breakdown voltage with 0 volts applied to the gate of an n-channel transistor and depends on the transistor fabrication process. In one exemplary technology discussed herein, BVDSS is approximately 13 volts for both n-channel and p-channel transistors. Thus, to avoid gated diode breakdown, the voltage across the drain/source must remain below the breakdown voltage, BVDSS, if the gate voltage is grounded. As previously indicated, however, in many semiconductor circuits, voltages greater than the breakdown voltage are needed. For example, the erase and program operations for non-volatile memories on a secure integrated circuit require voltage levels of 15 and 10 volts, respectively, on the high voltage power supply, $V_{ep}$. Thus, the 15 volts required on the gate of an exemplary non-volatile memory device during an erase mode is generally higher than the BVDSS of the high voltage transistors.

A number of techniques have been proposed for avoiding gated diode breakdown, such as placing an additional transistor in series with the existing transistor. The additional transistor is typically gated by $V_{dd}$, thus preventing the high voltage on the output from reaching the drain of the existing transistor and limiting the drain voltage on the existing transistor to a value below the breakdown voltage. While such techniques effectively prevent gated diode breakdown in the transistor, circuits including such gated diode breakdown protection techniques are typically only capable of switching between an output voltage of 0 volts and the high voltage level of 15 or 10 volts. For some applications, however, it is necessary, to switch between an output voltage of $V_{dd}$ and the high voltage level of 15 or 10 volts, which is not possible with such cascoded transistor implementations. For a more detailed discussion of such gated diode breakdown protection techniques, see, for example, U.S. patent application Ser. No. 10/338,551, entitled "Method and Apparatus for Avoiding Gated Diode Breakdown in Transistor Circuits," filed Jan. 8, 2003, assigned to the assignee of the present invention and incorporated by reference herein.

A need exists for an architecture and design that employ non-volatile floating gate Flash memory cells to emulate EEPROM functionality without incurring the program disturb issues discussed above. A further need exists for an architecture that minimizes memory overhead by dividing a memory array into small pages. Another further need exists for an architecture that reduces the number of unnecessary erase/program cycles and improves both effective endurance and effective program speed when only small amounts of data are changing. Yet another need exists for a protection circuit that prevents gated diode breakdown in N-channel transistors that have a high voltage across the drain/source of the transistor, and provides greater flexibility on the output voltages that may be obtained.

SUMMARY OF THE INVENTION

Generally, an emulated EEPROM memory array is disclosed based on nonvolatile floating gate memory cells, such as Flash cells. The emulated EEPROM memory array employs a common source line and common row lines for a small group of bits, so that the small group of bits may be treated as an isolated group during program and erase modes. In this manner, the issues of program disturb are controlled and, when data in a small number of bytes is changing, program speed and effective endurance is improved. The bits common to the shared source line make up the emulated EEPROM page, which is the smallest unit that can be erased and reprogrammed any number of times, without disturbing bits in other parts of the array. During an erase mode, the transistors connected to the same source line, must be selected together. During a program or read mode, only the transistors connected to the common row and source lines will see stress voltage. Thus, when a single byte is programmed, only the bytes sharing the same source line are subject to program disturb. These same bytes comprising an emulated EEPROM page in the architecture are erased as a group, thus the amount of disturb they receive is limited and predictable. Furthermore, since the page size is reduced, the time required to program all bytes in the page and the number of unnecessary erase and program cycles can be reduced.

According to another aspect of the invention, the memory array is physically divided up into groups of columns, to further reduce the size of an emulated EEPROM page. In one exemplary embodiment, there are four memory arrays, each consisting of 32 columns and 512 page rows (all four arrays providing a total of 1024 pages with each page having 8 bytes or 64 bits). In a memory sub-array consisting of single source lines, the number of columns in a sub-array directly affects the page size. On the other hand, the number of rows and total number of memory sub-arrays only affect the total number of pages available in the emulated EEPROM memory array. It is noted that a larger page size can be obtained by adding additional columns to each page, or by joining additional sources to the common source line. Likewise, a smaller page size, down to a single byte, can be achieved by reducing the number of columns included in each page or by reducing the number of bits attached to the common source.

A global row decoder is disclosed that decodes the major rows and a page row driver and a page source driver enable the individual rows and sources that make up a given array. The page row drivers and page source drivers are decoded by a combination of the global row decoder and a page row/source supply decoder, based on the addresses to be accessed and the access mode (erase, program or read). In this manner, the page row driver and page source driver contain minimum circuitry. The columns in a given array are decoded by a column decoder and multiplexer. Once a given page row driver is selected by the global row decoder, the corresponding row line is activated across each of the memory arrays in the emulated EEPROM memory array. The global row decoder coupled with the supply decoders significantly reduce the size of the row/source driver logic in each memory array and is an important aspect of the area efficiency and flexibility provided by the architecture of the present invention.

Protection circuits are also disclosed that prevent gated diode breakdown in N-channel transistors that have a high voltage across the drain/source of the transistor, and provide greater flexibility on the output voltages that may be obtained. The disclosed protection circuits can be employed in the page row and page source driver circuits and still provide desired output voltages. For example, the disclosed page row driver can deliver 0V, 1.5 V, VDD or 15V, as needed for various modes for the non-volatile memory. In addition, in order to satisfy the need for a more compact physical layout, the p-channel transistors in the page row drivers and page source drivers share the same well. The wells in adjacent page row drivers and page source drivers may also be joined together.

A more complete understanding of the present invention, as well as further features and advantages of the present invention, will be obtained by reference to the following detailed description and drawings.

DETAILED DESCRIPTION

The present invention allows a smaller area of memory, corresponding to the emulated EEPROM page, to be erased at a time and reprogrammed, without disturbing other areas of the larger memory array. It is noted that a conventional Flash memory array programs one byte at a time, based on the selected page source, row and column. Assuming that a single source line is shared by eight rows in a conventional Flash memory array having 128 columns, indicates that 127 bytes are disturbed when a single byte is programmed (8 rows times 128 bits, minus the byte being programmed). An emulated EEPROM memory array of similar size, in accordance with the exemplary embodiment of the present invention, however, only disturbs eight bytes when a single byte is programmed. While Flash cells were generally intended to be used for applications where large memory areas are erased or rewritten at a time (i.e., an entire memory array is typically erased at once), the present invention allows Flash cells to be implemented in applications where smaller areas of a larger memory array are processed at a time.

It is noted that the term "page row/source supply decoder" used herein corresponds to the terms "word lines" and "source lines" used in the parent application, now U.S. Pat. No. 6,400,603 (hereinafter, referred to as the "'603 patent"). In addition, the terms "page row driver" and "page source driver" used herein correspond to the term "control" in the '603 patent, and the term "global row decoder" used herein corresponds to the term "rowline" in the '603 patent.

Figure 2:
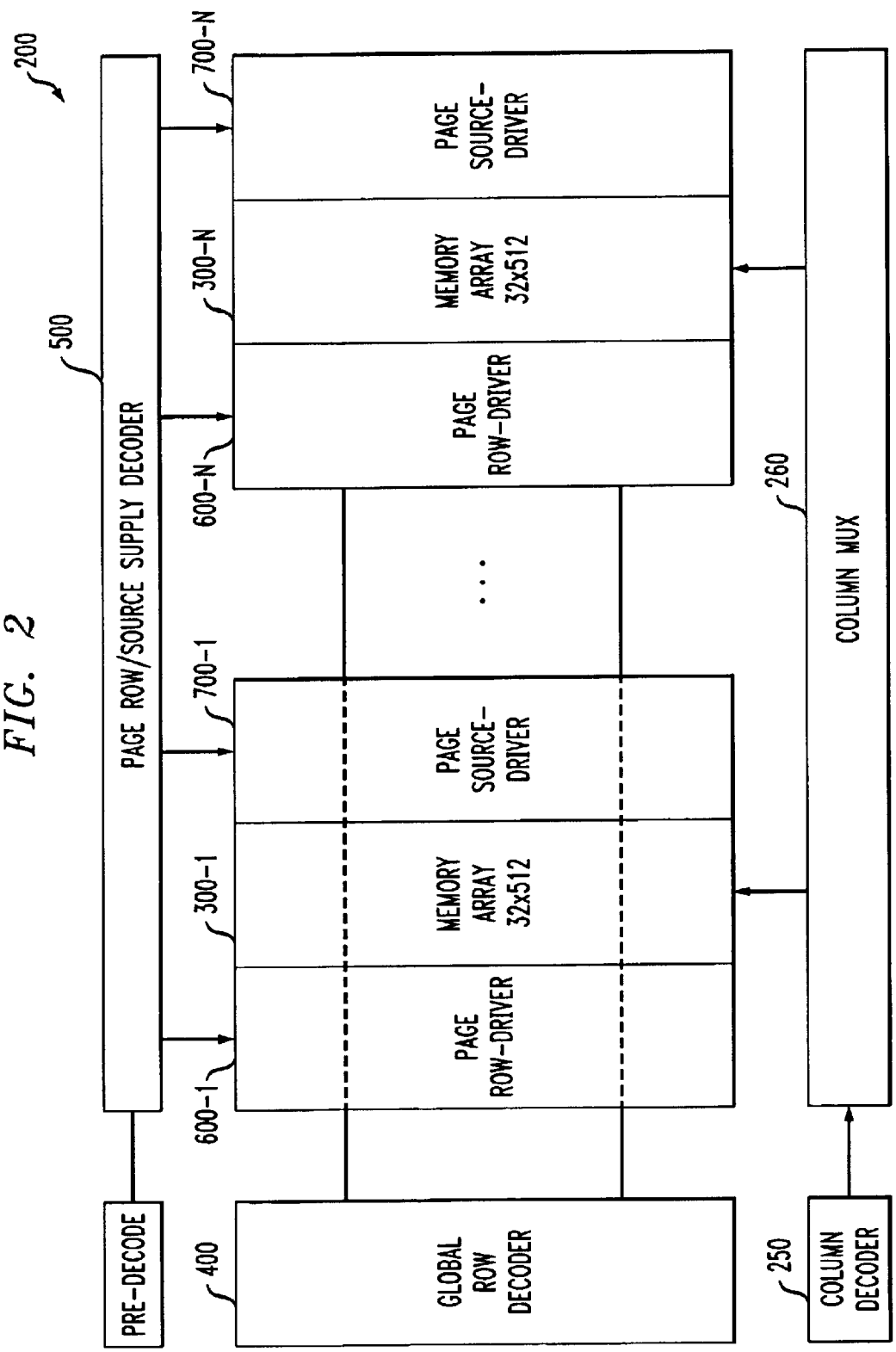
FIG. 2 is a schematic block diagram of an emulated EEPROM memory array incorporating features of the present invention.

FIG. 2 is a schematic block diagram of an emulated EEPROM memory array 200 incorporating features of the present invention. As shown in FIG. 2, the emulated EEPROM memory array 200 includes a plurality of memory arrays 300-1 through 300-N, discussed further below in conjunction with FIG. 3, embodied as Flash memory arrays. An exemplary embodiment of the present invention physically divides the memory up into four groups of X columns, where X is equal to the page size (in bytes) multiplied by eight divided by two. Thus, in an exemplary embodiment, there are four memory arrays 300-1 through 300-4, each consisting of 32 columns (X equals 32) and 512 page rows. While the number of columns in a memory sub-array (300) consisting of single source lines directly affects the page size, the number of rows and total number of memory arrays only affect the total number of pages available in the emulated EEPROM memory array 200, as would be apparent to a person of ordinary skill in the art. The exemplary embodiment, having four memory arrays 300-1 through 300-4, each consisting of 32 columns and 512 page rows, provides 1024 pages with each page having 8 bytes or 64 bits.

A global row decoder 400, discussed further below in conjunction with FIG. 4, decodes major rows in the emulated EEPROM memory array 200. The global row decoder 400 drives across each of the memory arrays 300-1 through 300-N and enables sets of page row drivers 600 and page source drivers 700, discussed further below in conjunction with FIGS. 6 and 7, respectively. The page row drivers 600 and page source drivers 700 are additionally enabled by a page row/source supply decoder 500, discussed further below in conjunction with FIG. 5. Generally, the global row decoder 400 decodes the major rows and the page row drivers 600 and page source drivers 700 enable the individual rows and sources that make up a given array 300. The columns in a given array 300 are decoded by a column decoder 250 and a column multiplexer 260.

Figure 3:
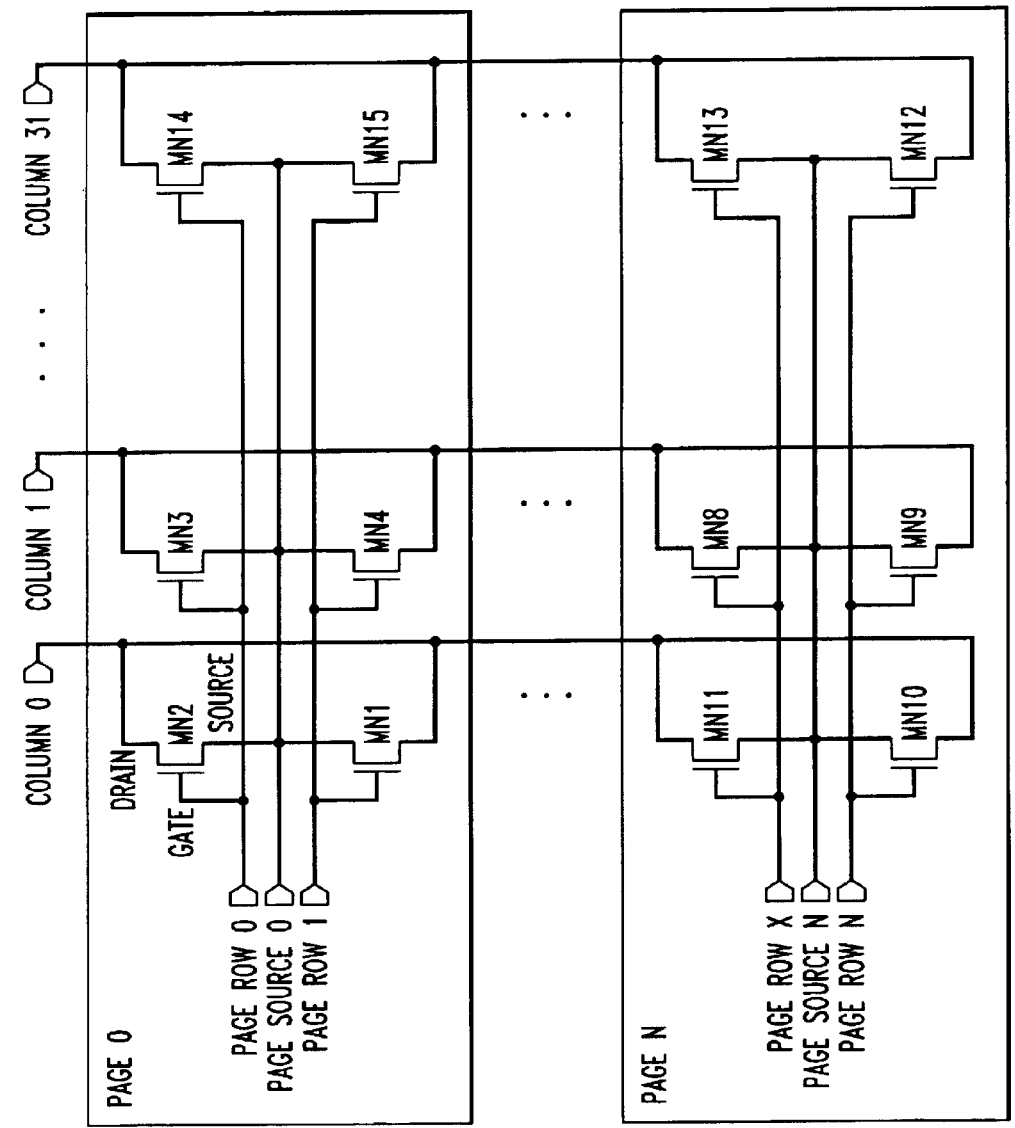
FIG. 3 is a circuit diagram illustrating an exemplary embodiment of one of the memory arrays of FIG. 2 in further detail.

FIG. 3 is a circuit diagram illustrating an exemplary embodiment of one of the memory arrays 300 of FIG. 2 in further detail. As shown in FIG. 3, each page consists of two rows, one source and 32 columns (bit lines). The bits on two adjacent rows share a common source line and therefore are part of the same page. For example, the transistors MN0, MN1, MN3, MN4, MN14 and MN15 in FIG. 3 are connected to the same source line, pagesource0. According to one aspect of the invention, each of the page rows connected to a common source are selected during an erase operation. Thus, the transistors connected to the same source line represent the smallest unit in the architecture of the present invention and are treated as a group during an erase mode. During an erase mode, the transistors connected to the same source line, for example, the transistors connected to pagerow0 and pagerow1 on page0 of FIG. 3, must be selected together. During a program or read mode, however, the transistors connected to the same row line, such as pagerow0 on page0 of FIG. 3 will experience approximately the same voltage on the source and pagerow lines, but appropriate voltages applied to the column lines can be used to inhibit the bits that do not correspond to the target byte. In this manner, when a single byte is programmed, only the eight bytes sharing the same source line are subject to program disturb. These same eight bytes comprising a page in the architecture are erased as a group. Also in this manner, only the eight bytes sharing the same source line are erased and programmed, thus reducing the time required to write new data into the page, compared to the prior art, and also improving the effective endurance when small numbers of bytes are written.

It is noted that a larger page size can be obtained by adding additional columns to each page, or joining additional sources to the common source line. Likewise, a smaller page size can be achieved by reducing the number of columns included in each page.

Figure 4:
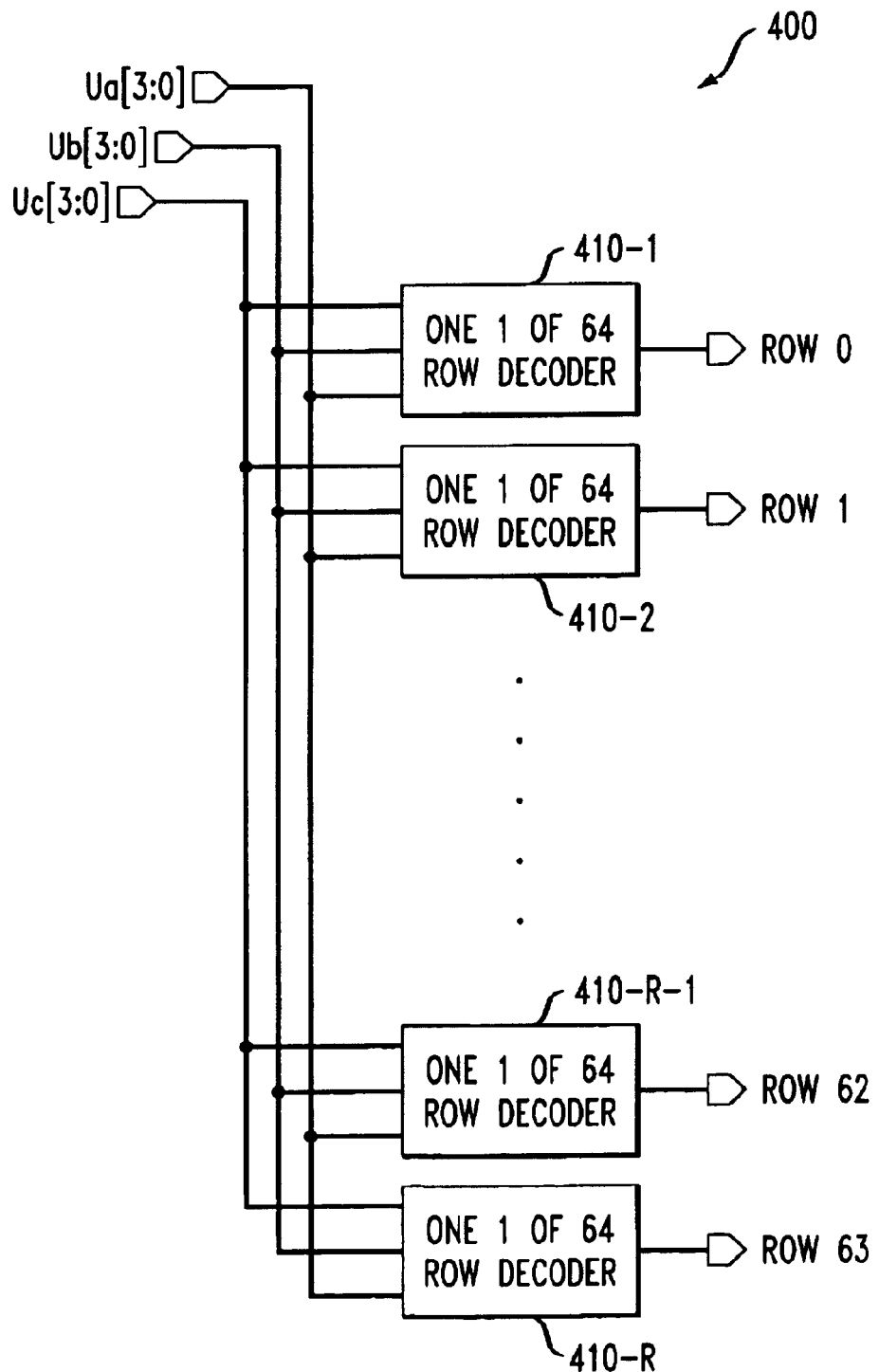
FIG. 4 is a schematic block diagram of the global row decoder of FIG. 2.

FIG. 4 is a schematic block diagram of the global row decoder 400 of FIG. 2. As shown in FIG. 4, the global row decoder 400 includes a row decoder 410-1 through 410-R for each global row in a given array 300. Thus, in the exemplary embodiment, the global row decoder 400 includes 64 row decoders 410. A given row decoder 410 is selected based on an appropriate value on three input lines Ua, Ub and Uc, which can each have one of four possible values (4^3 equals 64). Once a given row decoder 410 is selected, the corresponding row line is activated across each of the memory arrays 300 in the emulated EEPROM memory array 200.

As discussed further below in conjunction with FIGS. 6 and 7, for each memory array 300, the selected row decoder 410 enables a corresponding global row signal, row[63:0], that is applied to one set of eight row drivers 610 and one set of four source drivers 710. It is noted that the global row decoder 400 enabling each of the memory arrays 300 in the emulated EEPROM memory array 200 significantly reduces the size of the row/source driver logic (600, 700) corresponding to each memory array 300 and is an important aspect of the area efficiency provided by the architecture of the present invention. In a further variation, the decoding could be repeated in each memory array, and although feasible, would be expensive in terms of area.

Figure 5:
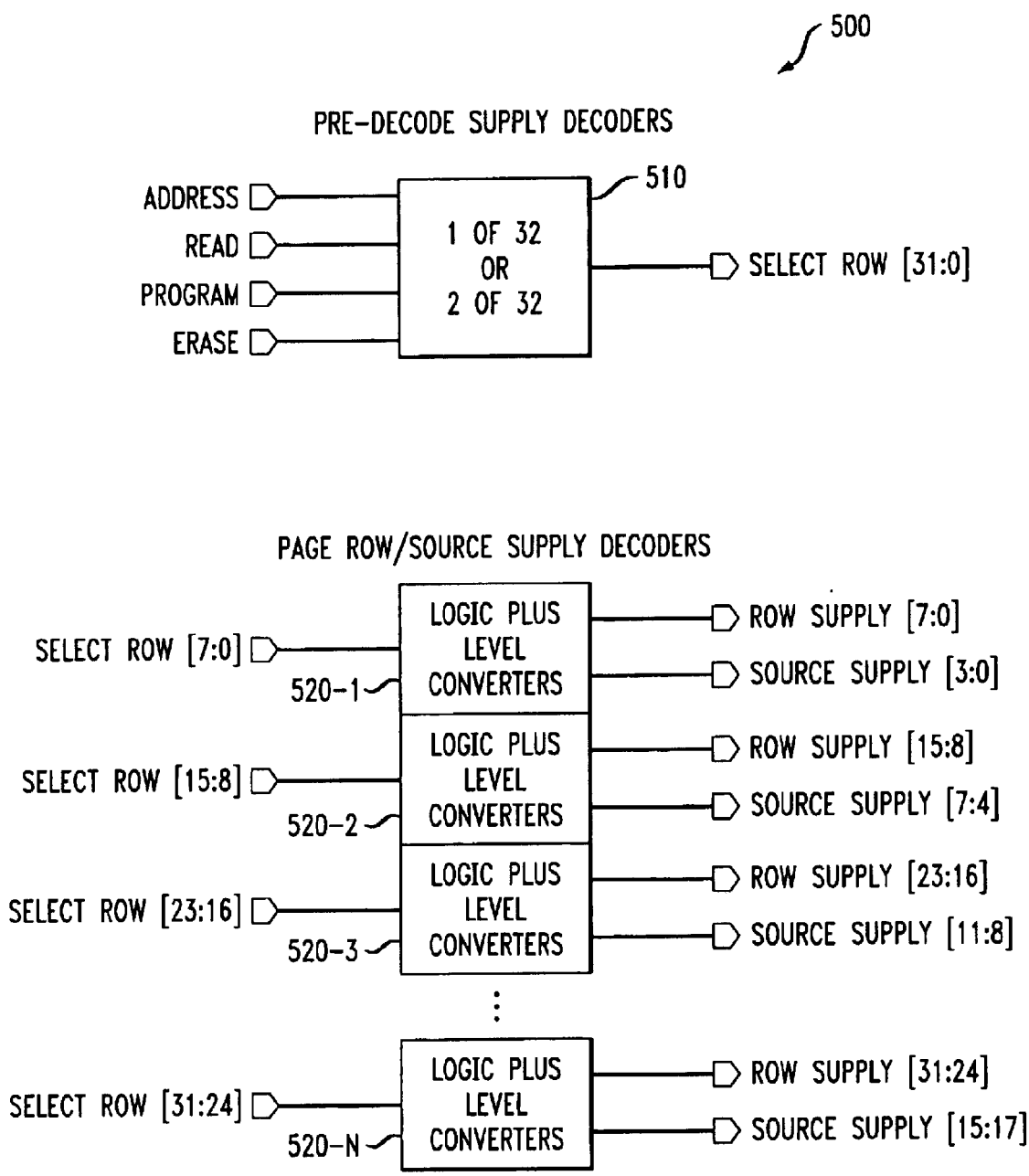
FIG. 5 is a schematic block diagram of the page row/source supply decoder of FIG. 2.

FIG. 5 is a schematic block diagram of the page row/source supply decoder 500. As shown in FIG. 5, the page row/source supply decoder 500 includes a front end pre-decoder 510 that receives one or more addresses, and control inputs to indicate whether the contents of the addressed byte(s) are to be read, programmed or erased. Based on the indicated address(es) and access mode, for a program or read mode, the pre-decoder 510 in conjunction with the logic plus level converters 520 in the page row/source supply decoders 500 will select one of 32 row pages (via signal "rowsupply [n]") and one of 16 source pages (via signal "sourcesupply [n]"). For an erase mode, the pre-decoder 510 in conjunction with the logic plus level converters 520 in the page row/source supply decoders 500 will select two of 32 row pages and one of 16 source pages corresponding to the indicated addresses. Note that a pair of rows are selected during an erase mode because the exemplary embodiment includes a page size of two rows and one source. It is also noted that the page row/source supply decoder 500 decodes the supplies to the page row and page source drivers 600, 700. By decoding the supplies in this manner, no additional decoding circuitry is needed in the drivers 600, 700 when combining the outputs from the global row decoder 400. The drivers themselves act as decoders. The combination of decoding global rows and pagerow/pagesource supplies in this manner further increases the efficiency of the architecture of the present invention.

The output of the pre-decoder 510, selectrow, is a 32 bit value indicating the selected row page(s) (and implicitly, the corresponding source page). The selectrow value is applied to a set of logic and level converter buffers 520-1 through 520-N. In the exemplary embodiment, the emulated EEPROM memory array 200 is divided into four memory arrays 300 and there is a logic and buffer 520 corresponding to each memory array 300. The selectrow value is translated by the appropriate logic and buffer 520 to activate the appropriate rowsupply and sourcesupply output signals. The rowsupply and sourcesupply outputs of each logic and buffer 520 are applied to the corresponding inputs of the page row drivers 600 and page source drivers 700 of the associated memory array 300.

Figure 6:
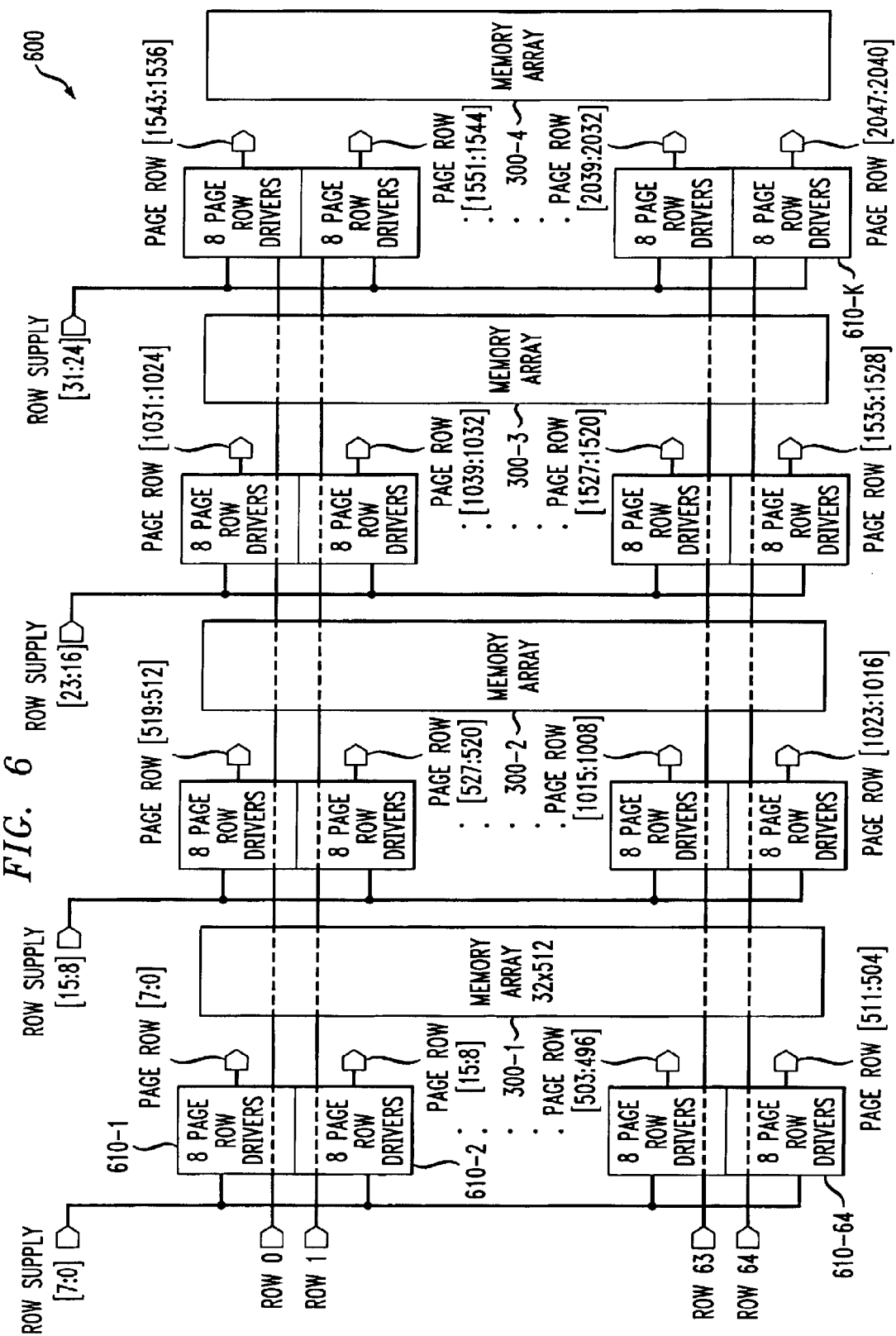
FIG. 6 is a schematic block diagram of the sets of page row drivers of FIG. 2.

FIG. 6 is a schematic block diagram of the sets of page row drivers 600 of FIG. 2. As shown in FIG. 6, the exemplary embodiment includes 256 sets of page row drivers 610-1 through 610-K. Each set of page row drivers drives eight page rows. The first vertical column of 64 page row drivers 610-1 through 610-64 is associated with the first memory array 300. For example, the first set of 64 page row drivers 610-1 through 610-64 is activated by the rowsupply output of the first logic and level converter buffer 520-1 of FIG. 5. The rowsupply output, together with the active global row line, row0 through row63, determines which single page row driver within a set of page row drivers 610 is activated. It is again noted that, in an erase mode, two adjacent rows are selected, while, in a program or read mode, only one row is selected.

Figure 7:
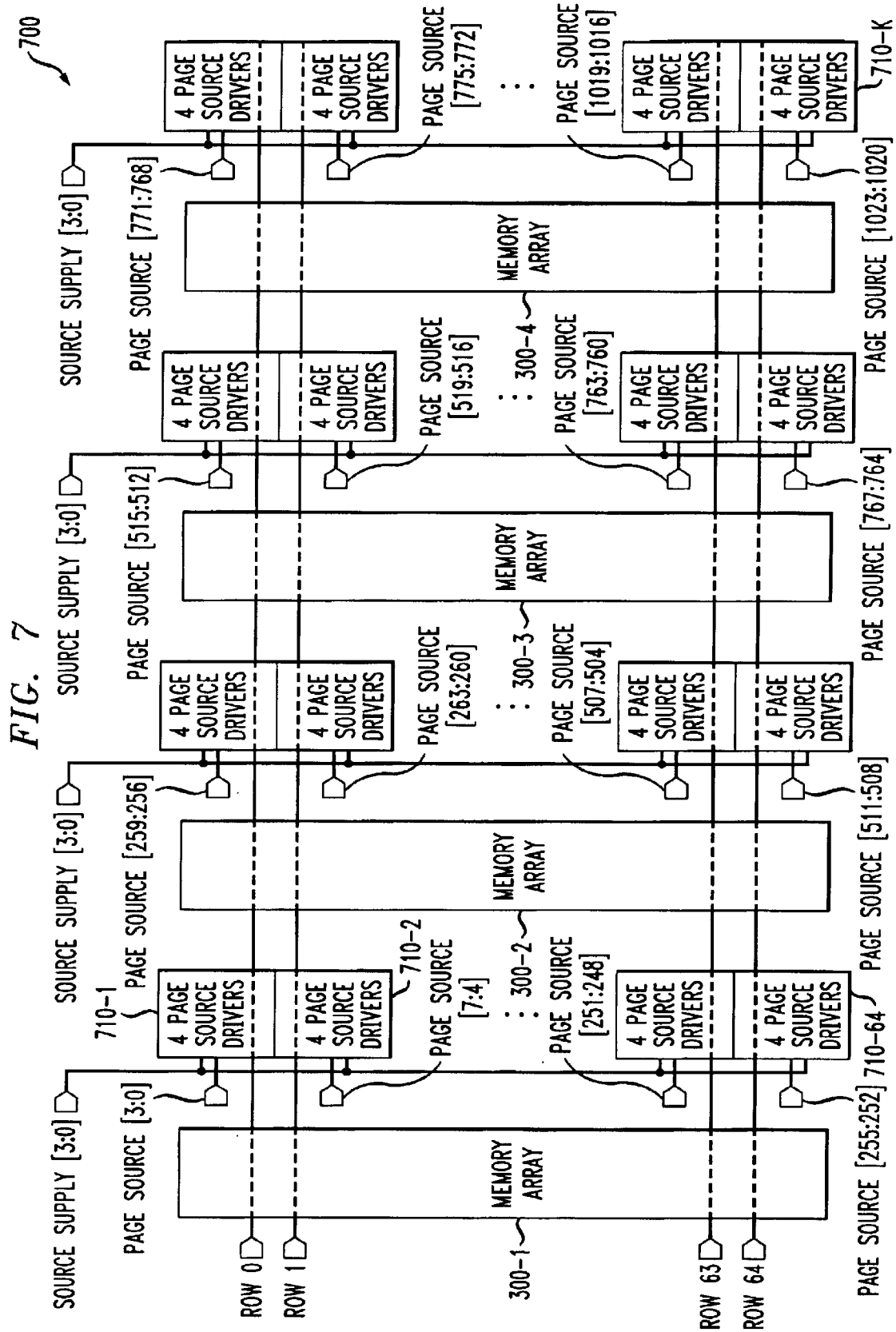
FIG. 7 is a schematic block diagram of the sets of page source drivers of FIG. 2.

FIG. 7 is a schematic block diagram of the sets of page source drivers 700 of FIG. 2. As shown in FIG. 7, the exemplary embodiment includes 256 sets of page source drivers 710-1 through 710-K. Each set of page source drivers drives four page sources. The first vertical column of 64 page source drivers 710-1 through 710-64 are associated with the first memory array 300. For example, the first set of 64 page source drivers 710-1 through 710-64 is activated by the sourcesupply output of the first logic and level converter buffer 520-1 of FIG. 5. The sourcesupply output, together with the active global row line, row0 through row63, determines which single page source driver within a set of page source drivers 710 is activated. It is again noted that a single page source is selected in an erase, program or read mode.

Breakdown Protection

Figure 1:
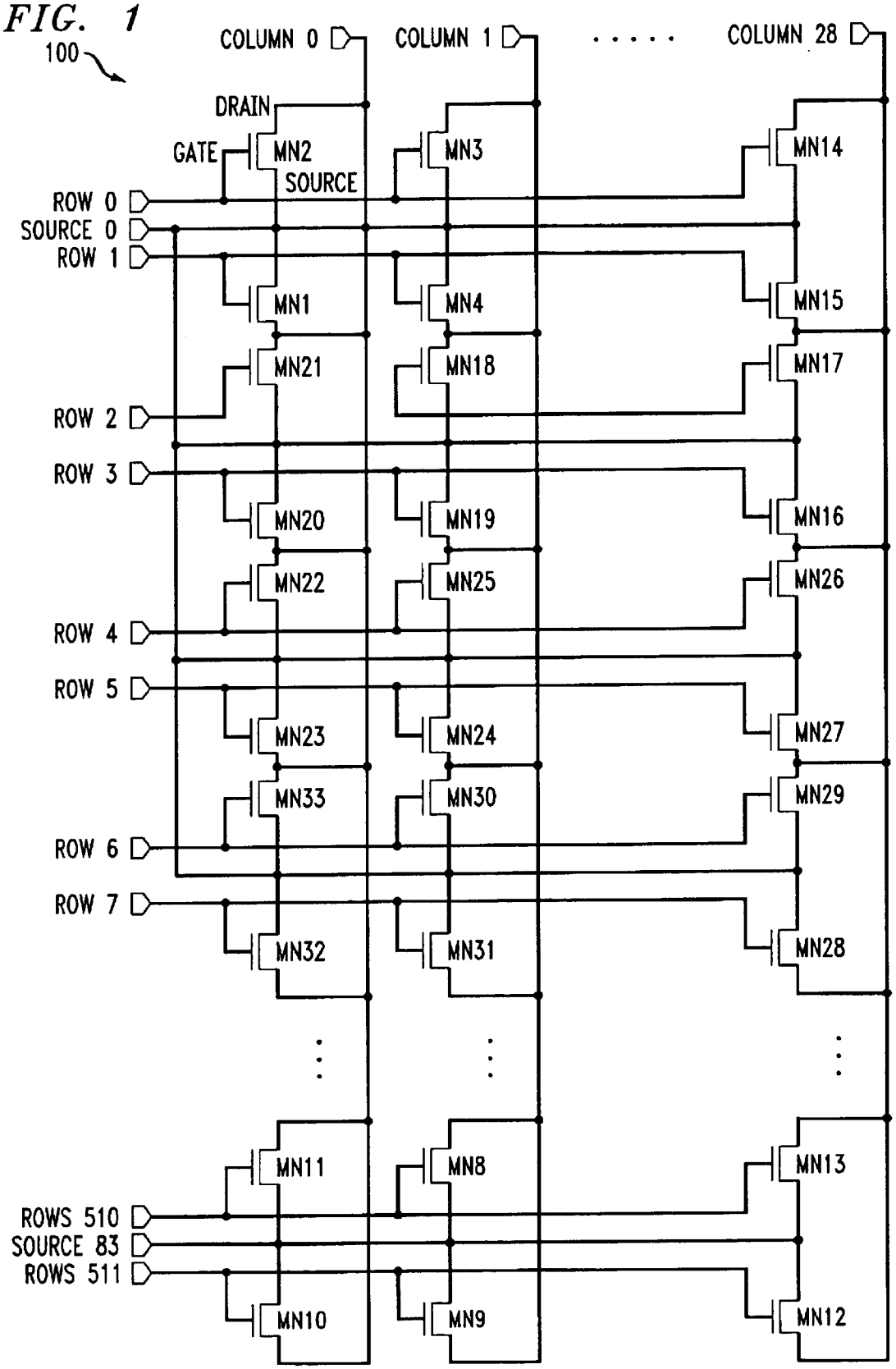
FIG. 1 is a circuit diagram illustrating a conventional array of split gate Flash transistors.

As previously indicated, certain voltages need to be applied to cells within the memory array 300 to perform read, erase and program operations. By way of example, FIG. 1 and FIG. 3 show arrays of split gate Flash cells, which may be embodied, for example, using the split gate Flash cells from Silicon Storage Technology, Inc. (SSTI) of Sunnyvale, Calif. The operation and voltage requirements of such cells are described in U.S. Pat. No. 6,400,603, incorporated herein by reference. While certain other types of cells may be substituted instead, the SSTI cell is used to illustrate the present invention. Table 1 shows the voltages required to perform read, erase and program operations for the exemplary SSTI cells. High voltages such as 15V on the row and 10V on the source are required for erase and program, respectively. A high voltage of 15V is used because it results in desirable erase characteristics such as reduced erase time, lower erase threshold and/or improved erase distribution statistics.

Read

TABLE 1A

Read Voltages

|  | Selected row, selected column | Selected row, unselected column | Unselected Row, selected column | Unselected Row, unselected column |
|---|---|---|---|---|
| Row | VDD (2.5V) | VDD (2.5V) | 0V | 0V |
| Source | 0V | 0V | 0V | 0V |
| Column | ~1.5V | 0C/float | ~1.5V | 0V/float |

Erase

TABLE 1B

Erase Voltages

|  | Selected row, selected column | Selected row, unselected column | Unselected Row, selected column | Unselected Row, unselected column |
|---|---|---|---|---|
| row | 15V | 15V | 0V | 0V |
| source | 0V | 0V | 0V | 0V |
| column | 0V | 0V | 0V | 0V |

Program

TABLE 1C

Program Coltages

|  | Selected row, selected column | Selected row, unselected column | Unselected Row, selected column | Unselected Row, unselected column |
|---|---|---|---|---|
| row | 1.5V | 1.5V | 0V | 0V |
| source | 10V | 10V | 0V | 0V |
| column | ~2 $\mu A$ | 0V | ~2 $\mu A$ | 0V |

The voltages shown in Table 1 are coupled onto the pagerow and pagesource nodes of FIG. 3 by the page row drivers 600 and page source drivers 700. The drivers need to couple high voltages onto selected pagerows and pagesources and also isolate high voltages from unselected pagerows and pagesources. A circuit that utilizes a single pass transistor and single discharge transistor, such as the circuit described in FIG. 4A of U.S. Pat. No. 6,400,603, is unsuitable for the present application. A voltage of 15V, as supplied to the input of a page row driver 600 is higher than the BVDSS of the high voltage transistors. As indicated above, BVDSS is the drain/source breakdown voltage with 0V applied to the gate of an n-channel transistor. For the exemplary technology discussed herein, BVDSS is approximately 13 volts for both n-channel and p-channel transistors. Therefore, if a single n-channel transistor is used to isolate an unselected pagerow by applying 0V to the gate of the single transistor, the BVDSS breakdown would limit the voltage on the high voltage supply and the voltage coupled to the selected pagerow would be reduced, as is well known. Note that high voltage supplies, as typically used on non-volatile memories have a high internal resistance and have a limited current sourcing capability. In any case, breakdown is undesirable and should be avoided.

Thus, a circuit is required to couple and isolate high voltages onto the pagerow and pagesource, as listed in Table 1.In the case of the pagerow, the voltage is above BVDSS. The required circuit is closely coupled to the memory arrays 300 and is repeated multiple times and physically located adjacent to the memory array 300. Thus, the required circuit should be physically compact so as to facilitate physical layout and interface to the small dimensions of a memory page.

Figure 8:
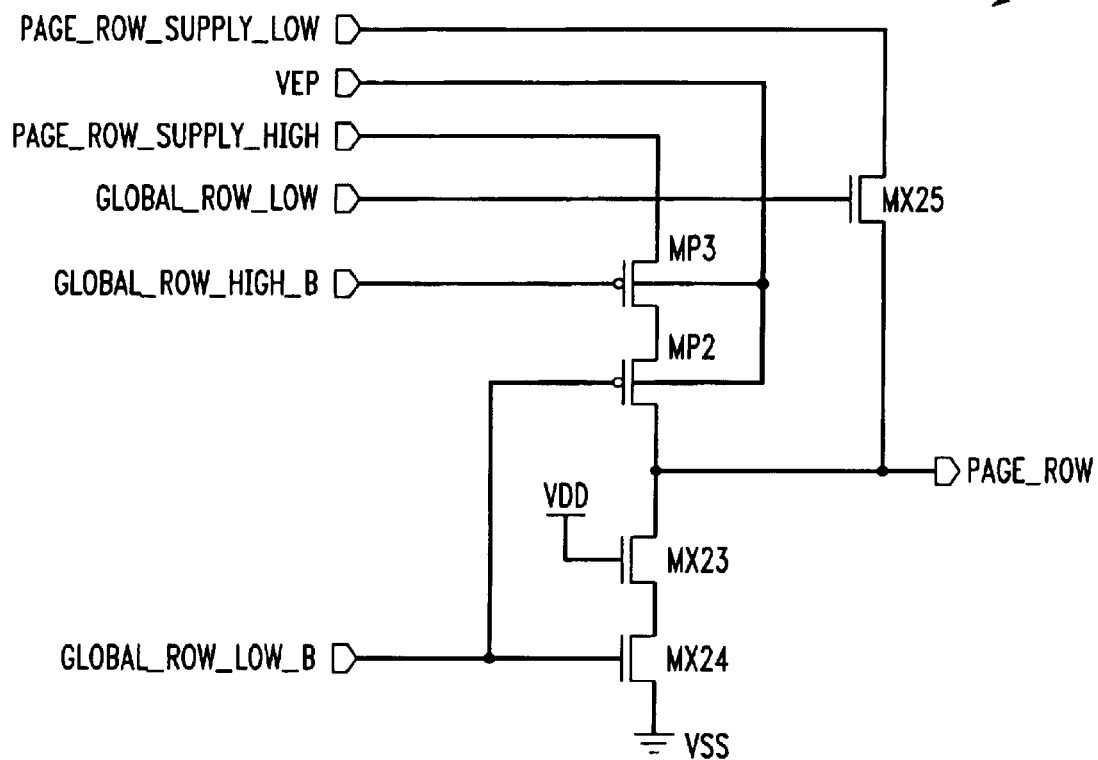
FIG. 8 is a schematic diagram of a single page row driver within a set of eight page row drivers in the exemplary embodiment of FIG. 6.

FIG. 8 is a schematic diagram of a single page row driver 800. The output "page_row" corresponds to any one of the signals pagerow [2047:0] of FIG. 6. The global row signals, row[63:0], that are generated by the global row decoder 400 shown in FIG. 4 are comprised of the "global_row_low," "global_row_high_b", and "global_row_low_b" signals that are applied as inputs to the single page row driver 800 of FIG. 8. "Vep" is a voltage supply, the level of which is dependent on the operating mode (erase, program or read) that is active. Similarly, the signals rowsupply[31:0] in FIGS. 5 and 6 are comprised of the "page_row_supply_low" and "page_row_supply_high" signals that are applied as inputs to the single page row driver 800 of FIG. 8.

Figure 9:
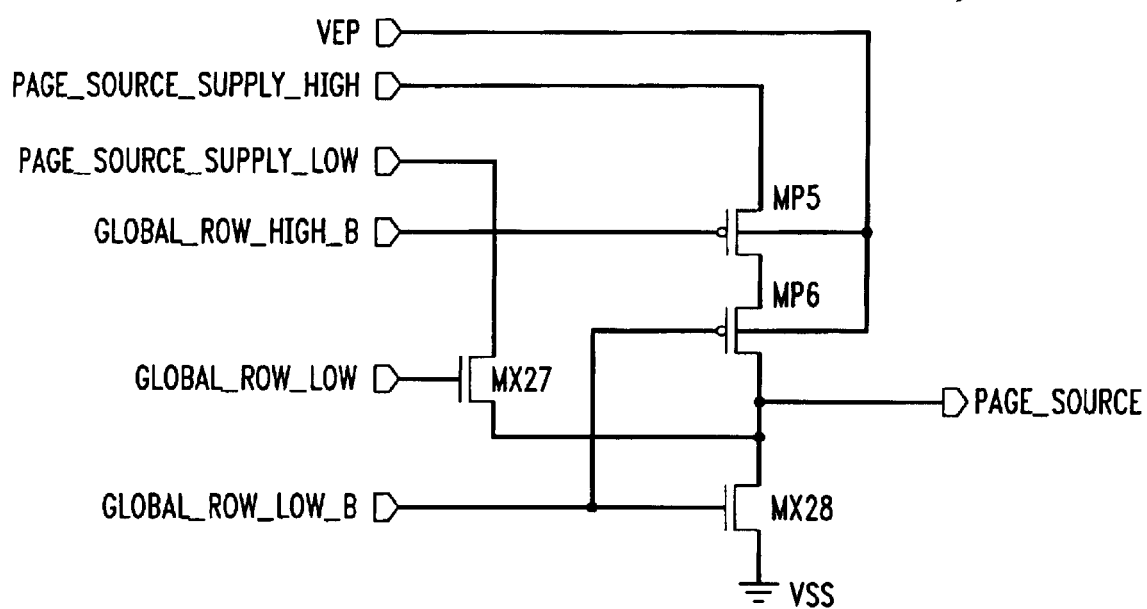
FIG. 9 is a schematic diagram of a single page source driver within a set of four page source drivers in the exemplary embodiment of FIG. 7.

FIG. 9 is a schematic diagram of a single page source driver 900. The output "page_source" corresponds to any one of the signals pagesource [1023:0] of FIG. 7. The global row signals, row[63:0], that are generated by the global row decoder 400 shown in FIG. 4 are comprised of the "global_row_low," "global_row_high_b", and "global_row_low_b" signals that are applied as inputs to the single page source driver 900 of FIG. 9. "Vep" is a voltage supply, the level of which is dependent on the operating mode (erase, program or read) that is presently active. Similarly, the signals rowsupply[31:0] in FIGS. 5 and 6 are comprised of the "page_source_supply_low" and "page_source_supply_high" signals that are applied as inputs to the single page source driver 900 of FIG. 9.

The voltages that are applied to the input signals of FIGS. 8 and 9 are shown in Table 2.

Read

TABLE 2A

Voltages applied to Page Row and Source Srivers during READ

| Signals | selected global row/selected supply | selected global row/un-selected supply | un-selected global row/selected supply | un-elected global row/un-selected supply |
|---|---|---|---|---|
| Vep | Vdd(2.5) | Vdd(2.5) | Vdd(2.5) | Vdd(2.5) |
| page_row_supply_low | Vdd(2.5) | 0V | Vdd(2.5) | 0V |
| page_row_supply_high | Vdd(2.5) | 0V | Vdd(2.5) | 0V |
| page_source_supply_low | 0V | 0V | 0V | 0V |
| page_source_supply_high | 0V | 0V | 0V | 0V |
| global_row_high_b | 0V | 0V | Vdd(2.5) | Vdd(2.5) |
| global_row_low_b | 0V | 0V | Vdd(2.5) | Vdd(2.5) |
| global_row_low | Vdd(2.5) | Vdd(2.5) | 0V | 0V |
| page_row | Vdd(2.5) | 0V | 0V | 0V |
| page_source | 0V | 0V | 0V | 0V |

Erase

TABLE 2B

Voltages applied to Page Row and Source Drivers during ERASE

| Signals | selected global row/selected supply | selected global row/un-selected supply | un-selected global row/selected supply | un-elected global row/un-selected supply |
|---|---|---|---|---|
| vep | 15V | 15V | 15V | 15V |
| page_row_supply_low | Vdd(2.5) | 0V | Vdd(2.5) | 0V |
| page_row_supply_high | 15V | Vdd(2.5) | 15V | Vdd(2.5) |
| page_source_supply_low | 0V | 0V | 0V | 0V |
| page_source_supply_high | Vdd(2.5) | Vdd(2.5) | Vdd(2.5) | Vdd(2.5) |
| page_row_high_b | Vdd(2.5) | Vdd(2.5) | 15V | 15V |
| global_row_low_b | 0V | 0V | Vdd(2.5) | Vdd(2.5) |
| global_row_low | Vdd(2.5) | Vdd(2.5) | 0V | 0V |
| page_row | 15V | 0V | 0V | 0V |
| page_source | 0V | 0V | 0V | 0V |

Program

TABLE 2C

Voltages applied to Page Row and Source Drivers during PROGRAM

| Signals | selected global row/selected supply | selected global row/un-selected supply | un-selected global row/selected supply | un-selected global row/un-selected supply |
|---|---|---|---|---|
| vep | 10V | 10V | 10V | 10V |
| page_row_supply_low | 1.5V | 0V | 1.5V | 0V |
| page_row_supply_high | 1.5V | 0V | 1.5V | 0V |
| page_source_supply_low | Vdd(2.5) | 0V | Vdd(2.5) | 0V |
| page_source_supply_high | 10V | 0V | 10V | 0V |
| global_row_high_b | 0V | 0V | 10V | 10V |
| global_row_low_b | 0V | 0V | Vdd(2.5) | Vdd(2.5) |
| global_row_low | Vdd(2.5) | Vdd(2.5) | 0V | 0V |
| page_row | 1.5V | 0V | 0V | 0V |
| page_source | 10V | 0V | 0V | 0V |

Table 2 shows that the possible output voltages on page_row are 0V, 1.5V, VDD (2.5V) and 15V. High voltage p-channel transistors are required to transfer 15V without voltage loss. An n-channel transistor would not be suitable for this purpose due to the prohibitively large voltages that would be required on the gate, resulting in breakdown and reliability problems. Thus, referring to FIG. 8, transistors MP2 and MP3 provide the path that connects page_row to page_row_supply_high. Note that in order to satisfy the need for compact physical layout, all p-channel transistors in the page row driver 800 and all p-channel transistors in the page source driver 900 must share the same well. The wells in adjacent page row drivers 800 and page source drivers 900 may also be joined together. A well is connected to the highest voltage supply, which is Vep, and can result in considerable threshold increases to the p-channel transistors. For example, in the exemplary embodiment, a back bias of 10V results in a high voltage p-channel transistor threshold greater than 1.5V. Thus, n-channel transistor MX25, which experiences much lower back bias, provides a path to page_row_supply_low (1.5V during program) for the selected row. Transistors MX23 and MX24 provide a path to Vss (0V) for the unselected row.

Transistors MX23 and MP2 act as high voltage cascode transistors that allow the circuit to avoid gated diode breakdown (i.e., operate above BVDSS). An important aspect of the invention is the combination of control and supply voltages that, when operating in cooperation with the cascode transistors, avoids gated diode breakdown in all functional modes. The key is not switching the high voltage (HV) supplies (page_row_supply_high, page_source_supply_high) and (HV) control line (global_row_high_b) to groundwhen unselected during erase but instead switching them to $V_{DD}$. For instance, during erase, VDD on the gate of transistor MP2 increases the breakdown of the unselected row, and $V_{DD}$ on the gate of transistor MP3 and $V_{DD}$ on the unselected supply increases the breakdown of the selected row, unselected supply. The path through transistor MP3 for the selected global row/unselected supply is turned off by also reducing the page_row_supply_high from 15V to $V_{DD}$. To avoid gated-diode breakdown during erase in selected global row/selected supply condition, both page_row_supply_low and global_row_low are brought to VDD.

Referring to FIG. 9, transistors MP5 and MP6 connect page_source to page_source_supply_high source (which could be at a voltage equal to $V_{DD}$ or 10V). Transistors MP5 and MP6 are cascoded for gated-diode protection during erase, during which time the voltage on their well is equal to 15V. Therefore, to protect transistor MP5 against breakdown, the voltage on page_source_supply_high is taken to $V_{DD}$ during erase. Transistor MX28 provides a path to ground for unselected global rows. Transistor MX27 is needed to provide a path for the selected global rows to apply 1.5V to page_rows during programming.

The details of the circuits employed in the global row decoder 400 and the page row/source supply decoder 500 are not shown. Rather, it is the combination of control voltages and supply voltages (i.e., the output voltages of the global row decoder 400 and the page row/source supply decoder 500), operating in cooperation with the circuits shown in FIGS. 8 and 9 that is pertinent to the present invention. Examples of the circuit design techniques that can be employed in the global row decoder 400 and the page row/source supply decode 500 are described in co-pending U.S. patent application Ser. No. 10/338,551, entitled "Method and Apparatus for Avoiding Gated Diode Breakdown in Transistor Circuits," filed Jan. 8, 2003, assigned to the assignee of the present invention and incorporated by reference herein.

While the memory architectures described herein have been demonstrated, by way of example, with a split gate cell, it should be noted that various other memory cell types might also be employed. Moreover, the examples contained within are illustrative and several variations are possible within the context of the invention. The number of cells within a page, the number of pages that are coupled to page row drivers and page source drivers and the number of pages within an array can be modified according to the requirements of the application. Endurance, average write time per cell, compactness, ease of interfacing and control are features that can be altered by adjusting the above parameters.

Increasing the number of cells within a page can reduce the average write time per cell because the single, more lengthy, erase operation is shared between more cells, albeit at the cost of a longer programming time. This is advantageous for systems in which large blocks of data are being written simultaneously and can also result in a more compact physical layout. However, this is at the cost of reduced endurance for applications that change small amounts of data at any one time and also at the cost of an increased number of disturb events. An increased number of pages per page row driver and page source driver and an increased number of cells per page can increase the physical dimensions in the vertical and horizontal directions, respectively. Since the memory cell array consists of an array of single transistors, usually with minimum feature sizes, the additional physical space at the periphery of the array is advantageous. Such space facilitates the placement of global row decoders 400, page row/source supply circuits 500, page row drivers 600 and page source drivers 700. Thus, the architecture can be modified in order to achieve the desired trade off between endurance, disturb, page write time, average write time per cell, data organization, ease of interfacing and physical compactness.

It is to be understood that the embodiments and variations shown and described herein are merely illustrative of the principles of this invention and that various modifications may be implemented by those skilled in the art without departing from the scope and spirit of the invention.

We claim:

1. An array of non-volatile floating gate memory cells arranged in a plurality of rows and columns, a plurality of said memory cells electrically coupled to form a plurality of pages, said array comprising:

a plurality of page row lines, each of said page row lines connected to a gate of one or more of said memory cells in one of said rows;

a plurality of page source lines, each of said page source lines connected to a source of one or more of said memory cells in one of said pages, wherein each of said pages includes each of said plurality of non-volatile floating gate memory cells that are subject to program disturb voltages when at least one of said plurality of non-volatile floating gate memory cells within a same page is programmed;

a plurality of column lines, each of said column lines connected to a drain of all of said memory cells in one of said columns; and a global row decoder to decode major rows in said memory array.

2. The array of claim 1, wherein said non-volatile floating gate memory cells are flash cells.

3. The array of claim 1, wherein each of said pages of memory cells sharing a common source line includes at least two rows of said memory cells in said page.

4. The array of claim 1, wherein said columns in said array are further divided into a plurality of sub-arrays comprised of one or more groups of columns to reduce a size of said pages, said group of columns consists of one or more of said columns, each column in said group connects to a drain of all said non-volatile floating gate memory cells in a column of each page.

5. The array of claim 4, further comprising:
a plurality of page row drivers, each of said page row drivers selectively couples signals to said page row lines,
a plurality of page source drivers, each of said page source drivers selectively couples signals to said page source lines,
a plurality of word lines, one or more of said word lines connect to said page row drivers, said plurality of word lines are selectively coupled to said page row lines,
a plurality of source lines, one or more of said source lines connect to said page source drivers, said plurality of source lines are selectively coupled to said page source lines.

6. The array of claim 1, wherein said page row lines associated with each of said memory cells in one of said pages must be selected during an erase operation.

7. The array of claim 1, further comprising a set of page row drivers that are decoded by said global row decoder and a page row supply decoder, based on said memory cells to be accessed and an indication of an access mode to enable individual rows of said array.

8. The array of claim 1, further comprising a set of page source drivers that are decoded by said global row decoder and a page source supply decoder, based on said memory cells to be accessed and an indication of an access mode to enable the individual sources of said array.

9. The array of claim 1, further comprising a decoder for decoding page rows and page sources in said memory array.

10. A method for programming a memory array comprised of a plurality of non-volatile floating gate memory cells arranged in a plurality of one or more rows and columns, each of said memory cells having a drain, gate and source terminal, a plurality of said memory cells electrically coupled to form a plurality of pages, said method comprising:
applying a voltage to at least one page source line connected to a source of each of said memory cells in one of said pages, wherein each of said pages includes each of said plurality of non-volatile floating gate memory cells that are subject to program disturb voltages when at least one of said plurality of non-volatile floating gate memory cells within a same page is programmed; and
decoding major rows in said memory array using a global row decoder.

11. The method of claim 10, wherein said non-volatile floating gate memory cells are flash cells.

12. The method of claim 10, wherein each of said pages of memory cells sharing a common source line includes at least two rows of said memory cells in said page.

13. The method of claim 10, wherein said columns in said array are further divided into a plurality of sub-arrays comprised of one or more groups of columns to reduce a size of said pages, said group of columns consists of one or more of said columns, each column in said group connects to a drain of all said non-volatile floating gate memory cells in a column of each page.

14. The method of claim 10, wherein said page row lines associated with each of said memory cells in one of said pages must be selected during an erase operation.

15. The method of claim 10, further comprising the step of decoding page rows and page sources in said memory array.

16. An array of non-volatile floating gate memory cells arranged in a plurality of rows and columns, a plurality of said memory cells electrically coupled to form a plurality of pages, said array comprising:
a plurality of page row lines, each of said page row lines connected to a gate of one or more of said memory cells in one of said rows;
a plurality of page source lines, each of said page source lines connected to a source of one or more of said memory cells in one of said pages, wherein each of said pages includes each of said plurality of non-volatile floating gate memory cells that are subject to erase conditions when at least one of said plurality of said non-volatile floating gate memory cells is erased within said same page;
a plurality of column lines, each of said column lines connected to a drain of all of said memory cells in one of said columns; and
a global row decoder to decoder major rows in said memory array.

17. An array of non-volatile floating gate memory cells arranged in a plurality of rows and columns, a plurality of said memory cells electrically coupled to form a plurality of pages, said array comprising:
a plurality of page row lines, each of said page row lines connected to a gate of one or more of said memory cells in one of said rows;
a plurality of page source lines, each of said page source lines connected to a source of one or more of said memory cells in one of said pages, wherein each of said non-volatile floating gate memory cells within each of said pages is erased when one of said non-volatile floating gate memory cells within each of said pages is erased;
a plurality of column lines, each of said column lines connected to a drain of all of said memory cells in one of said columns; and
a global row decoder to decode major rows in said memory array.

* * * * *

UNITED STATES PATENT AND TRADEMARK OFFICE
CERTIFICATE OF CORRECTION

PATENT NO.    : 6,950,336 B2
DATED         : September 27, 2005
INVENTOR(S)   : Sowards et al.

It is certified that error appears in the above-identified patent and that said Letters Patent is hereby corrected as shown below:

Column 9,
Line 33, replace "0C/float" with -- 0V/float --.
Line 52, replace "Program Coltages" with -- Program Voltages --.

Signed and Sealed this

Ninth Day of May, 2006

JON W. DUDAS
*Director of the United States Patent and Trademark Office*